United States Patent
Maeshima et al.

(10) Patent No.: US 10,332,795 B2
(45) Date of Patent: *Jun. 25, 2019

(54) MANUFACTURING METHOD OF SEMICONDUCTOR DEVICE

(71) Applicant: RENESAS ELECTRONICS CORPORATION, Tokyo (JP)

(72) Inventors: Kiyoshi Maeshima, Ibaraki (JP); Kotaro Horikoshi, Ibaraki (JP); Katsuhiko Hotta, Ibaraki (JP); Toshiyuki Takahashi, Ibaraki (JP); Hironori Ochi, Ibaraki (JP); Kenichi Shoji, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/670,867

(22) Filed: Aug. 7, 2017

(65) Prior Publication Data

US 2017/0358489 A1 Dec. 14, 2017

Related U.S. Application Data

(63) Continuation of application No. 15/147,591, filed on May 5, 2016, now Pat. No. 9,761,487.

(30) Foreign Application Priority Data

Jun. 11, 2015 (JP) ................................. 2015-118656

(51) Int. Cl.
*H01L 21/00* (2006.01)
*H01L 21/768* (2006.01)
(Continued)

(52) U.S. Cl.
CPC .... *H01L 21/76879* (2013.01); *H01L 21/0206* (2013.01); *H01L 21/0209* (2013.01);
(Continued)

(58) Field of Classification Search
CPC ......... H01L 21/76879; H01L 29/66477; H01L 23/53295; H01L 21/0209; H01L 21/0206; H01L 21/32125
See application file for complete search history.

(56) References Cited

U.S. PATENT DOCUMENTS 5,470,792 A 11/1995 Yamada
8,119,020 B2 2/2012 Ito et al.
(Continued)

FOREIGN PATENT DOCUMENTS

JP 07-263295 A 10/1995
JP 10-74724 A 3/1998
(Continued)

OTHER PUBLICATIONS

Non-Final Office Action issued in related U.S. Appl. No. 15/147,591, dated Oct. 20, 2016.
(Continued)

*Primary Examiner* — Reema Patel
(74) *Attorney, Agent, or Firm* — McDermott Will & Emery LLP

(57) ABSTRACT

It is to provide a manufacturing method of a semiconductor device including the following steps of: preparing a semiconductor substrate having a silicon nitride film on the rear surface; forming an interlayer insulating film having a via hole on the main surface of the semiconductor substrate; and forming a via-fill selectively within the via hole. The method further includes the steps of: performing the wafer rear surface cleaning to expose the surface of the silicon nitride film formed on the rear surface of the semiconductor sub-
(Continued)

strate; and thereafter, forming a photoresist film made of chemical amplification type resist on the interlayer insulating film and the via-fill over the main surface of the semiconductor substrate, in which the semiconductor substrate is stored in an atmosphere with the ammonium ion concentration of 1000 μg/m³ and less.

8 Claims, 17 Drawing Sheets

(51) Int. Cl.
| | |
|---|---|
| H01L 21/02 | (2006.01) |
| H01L 21/311 | (2006.01) |
| H01L 21/321 | (2006.01) |
| H01L 23/532 | (2006.01) |
| H01L 29/66 | (2006.01) |
| H01L 21/027 | (2006.01) |
| H01L 23/485 | (2006.01) |

(52) U.S. Cl.
CPC .. *H01L 21/02074* (2013.01); *H01L 21/31144* (2013.01); *H01L 21/3212* (2013.01); *H01L 21/76808* (2013.01); *H01L 21/76832* (2013.01); *H01L 21/76834* (2013.01); *H01L 23/53223* (2013.01); *H01L 23/53238* (2013.01); *H01L 23/53295* (2013.01); *H01L 29/66477* (2013.01); H01L 21/0273 (2013.01); H01L 21/76826 (2013.01); *H01L 23/485* (2013.01); *H01L 23/53252* (2013.01); *H01L 29/6659* (2013.01)

(56) References Cited

U.S. PATENT DOCUMENTS

| | | | |
|---|---|---|---|
| 9,018,689 B1 | 4/2015 | Hirochi et al. | |
| 9,761,487 B2* | 9/2017 | Maeshima | H01L 21/76879 |
| 2002/0197856 A1 | 12/2002 | Matsuse et al. | |
| 2004/0089924 A1* | 5/2004 | Yuasa | H01L 21/02126 257/673 |
| 2006/0131754 A1 | 6/2006 | Ohtake et al. | |
| 2006/0148244 A1* | 7/2006 | Kim | H01L 21/0209 438/639 |
| 2008/0261399 A1* | 10/2008 | Choi | H01L 21/02074 438/692 |
| 2009/0011566 A1* | 1/2009 | Okada | H01L 21/0206 438/308 |
| 2009/0202951 A1* | 8/2009 | Yamamoto | G03F 7/168 430/322 |
| 2010/0093139 A1* | 4/2010 | Futase | H01L 21/28052 438/197 |
| 2010/0227461 A1 | 9/2010 | Ochi | |
| 2012/0032323 A1 | 2/2012 | Matsumoto et al. | |
| 2012/0295415 A1 | 11/2012 | Ono | |
| 2013/0062777 A1* | 3/2013 | Ogata | H01L 24/05 257/774 |
| 2013/0207242 A1 | 8/2013 | Lee et al. | |
| 2013/0285203 A1 | 10/2013 | Hiroi et al. | |
| 2014/0077288 A1* | 3/2014 | Yamamoto | H01L 29/665 257/329 |
| 2014/0147982 A1* | 5/2014 | Ogata | H01L 29/6656 438/303 |
| 2015/0011036 A1* | 1/2015 | Naber | H01L 31/1876 438/57 |
| 2015/0118837 A1 | 4/2015 | Shieh et al. | |
| 2015/0206841 A1* | 7/2015 | Ito | H01L 23/53238 257/751 |
| 2016/0276267 A1 | 9/2016 | Lee et al. | |
| 2016/0293408 A1* | 10/2016 | Komatsu | C08F 293/00 |

FOREIGN PATENT DOCUMENTS

| | | |
|---|---|---|
| JP | 2008-024429 A | 2/2008 |
| JP | 2010-206056 A | 9/2010 |
| WO | 2010/125682 A1 | 11/2010 |

OTHER PUBLICATIONS

Notice of Allowance issued in related U.S. Appl. No. 15/147,591, dated May 5, 2017.

Japanese Office Action issued in corresponding Japanese Patent Application No. 2015-118656, dated Sep. 18, 2018, with English Translation.

* cited by examiner

MANUFACTURING METHOD OF SEMICONDUCTOR DEVICE

CROSS-REFERENCE TO RELATED APPLICATIONS

This application is a continuation of U.S. patent application Ser. No. 15/147,591, filed May 5, 2016, which claims the benefit of Japanese Patent Application No. 2015-118656 filed on Jun. 11, 2015 including the specification, drawings and abstract is incorporated herein by reference in its entirety.

BACKGROUND

The invention relates to a manufacturing method of a semiconductor device and particularly, to a technique effectively applied to a manufacturing method of a semiconductor device using a sealed type transfer container for carrying a semiconductor wafer.

For example, in a semiconductor device manufacturing method, using a semiconductor wafer having a diameter of 300 mm, a plurality of semiconductor wafers are pun in the sealed type transfer container called Front Open Unified Pod (FOUP) and carried among the processors.

Japanese Unexamined Patent Application Publication No. 2008-24429 (Patent Document 1) shows that when a PSZ film is used to embed an element isolation insulating film, a deformation of a pattern occurs in the next photolithography process, hence to degrade the performance of the photolithography process. In other words, Si—N bond included in the PSZ film is hydrolyzed with water in the environment, to generate $NH_3$, and a high sensibility photoresist of chemical amplification type photoresist used in the photolithography process reacts with basic compound including nitrogen atoms such as $NH_3$ or amine, hence to generate a pattern deformation. In the Japanese Unexamined Patent Application Publication No. 2008-24429, an inactive gas is introduced into a sealed type transfer container carried among the processes with semiconductor wafers accommodated therein, to reduce the humidity inside the sealed type transfer container more than the humidity of the environment such as a clean room, thereby avoiding the abovementioned pattern deformation.

The paragraph [0118] of International Patent Laid-Open No. 2010-125682 (Patent Document 2) discloses that a barrier insulating film BI1 is formed in a stacked structure of an SiCN film and an SiCO film in order to avoid resist poisoning. In other words, by applying an ammonia plasma treatment on the surface of an interlayer insulating film IL1 nitrogen existing on the surface of the interlayer insulating film IL1 and nitrogen included in the SiCN film are chemically reacted together to generate amine, which is diffused to the interlayer insulating film IL2 on the barrier insulating film BI1. Then, the chemical amplification type resist used for forming a wiring groove in the interlayer insulating film IL2 reacts with the amine, to generate a pattern failure in a photoresist film FR2; however, by providing the SiCO film between the SiCN film and the interlayer insulating film IL2, the amine is suppressed from diffusing to the interlayer insulating film IL2, thereby avoiding the resist poisoning.

SUMMARY

Also, in a copper (Cu) wiring structure examined by the inventor et al., similarly to the International Patent Laid-Open No. 2010-125682, a barrier insulating film having a stacked structure of an SiON film and an SiCO film is used. According to the examination by the inventor et al., even when using the barrier insulating film having the stacked structure, it is found that a pattern failure of chemical amplification type resist called resist poisoning occurs also in the photolithography process of forming a wiring groove in an interlayer insulating film on the barrier insulating film.

According to the examination by the inventor et al., it is found that the above failure is caused by nitrogen or ammonium ion released from the silicon nitride film remaining on the rear surface of the semiconductor wafer during the manufacturing process of the copper (Cu) wiring. When the silicon nitride film is deposited on the main surface of the semiconductor wafer, for example, in a batch typed Low Pressure Chemical Vapor Deposition (LPCVD) method, the silicon nitride film is also deposited on the rear surface of the semiconductor wafer. In the cleaning step included in the manufacturing process of a semiconductor device, the silicon nitride film formed on the rear surface is not eliminated but remains on the rear surface of the semiconductor wafer, and in this state as it remains, the manufacturing process of a semiconductor device is continued, to complete a semiconductor device. The silicon nitride film is removed in the rear surface polishing process of a semiconductor wafer for thinning the semiconductor wafer. Accordingly, for example, in the manufacturing process of a copper wiring, in a state where the silicon nitride film is formed on the rear surface of the semiconductor wafer, the manufacturing process of the copper wiring is performed. In some cases, a silicon oxide film is formed in the batch typed LPCVD method and the silicon oxide film is deposited also on the rear surface of the semiconductor wafer; however, the silicon oxide film is removed in the above cleaning step.

In the manufacturing process of the copper wiring, a semiconductor wafer is carried among the processes, being stored in the sealed type transfer container called FOUP. Since airtightness of the sealed type transfer container is high, for example, when the stored time gets longer because of a trouble of a device, the nitrogen or ammonium ion released from the silicon nitride film remaining on the rear surface of the semiconductor wafer raises the nitrogen concentration or ammonium concentration (hereinafter, described as the ammonium concentration) within the sealed type transfer container. A large amount of the ammonium ion is attached to the main surface of the semiconductor wafer, and it is found that a pattern failure of a chemical amplification type resist, called resist poisoning, occurs in the photolithography process using the chemical amplification type resist. The ammonium ion attached to the main surface of the semiconductor wafer generates amine and disturbs acid generation in the ultraviolet ray exposure portion of the positive chemical amplification type resist, hence to generate a pattern failure while inactivating the chemical amplification type resist. Further, breaking of the copper wiring occurs and the reliability of the semiconductor device is deteriorated.

Accordingly, in the manufacturing method of a semiconductor device, a technique for improving the reliability of the semiconductor device is required.

Other problems and new features will be apparent from the description and the attached drawings of the specification.

According to one embodiment, a semiconductor substrate having a silicon nitride film on its rear surface is prepared, an interlayer insulating film having a via hole on the main surface of the semiconductor substrate is formed, and a first photoresist film is formed selectively within the via hole.

Next, the wafer rear surface cleaning is performed to expose the surface of the silicon nitride film formed on the rear surface of the semiconductor substrate, and thereafter, a second photoresist film made of chemical amplification type resist is formed on the interlayer insulating film and the first photoresist film over the main surface of the semiconductor substrate. During these processes, the semiconductor substrate is stored in an atmosphere with the ammonium ion concentration of 1000 μg/m$^3$ and less.

According to one embodiment, the reliability of a semiconductor device can be improved.

DETAILED DESCRIPTION

Figure 1:
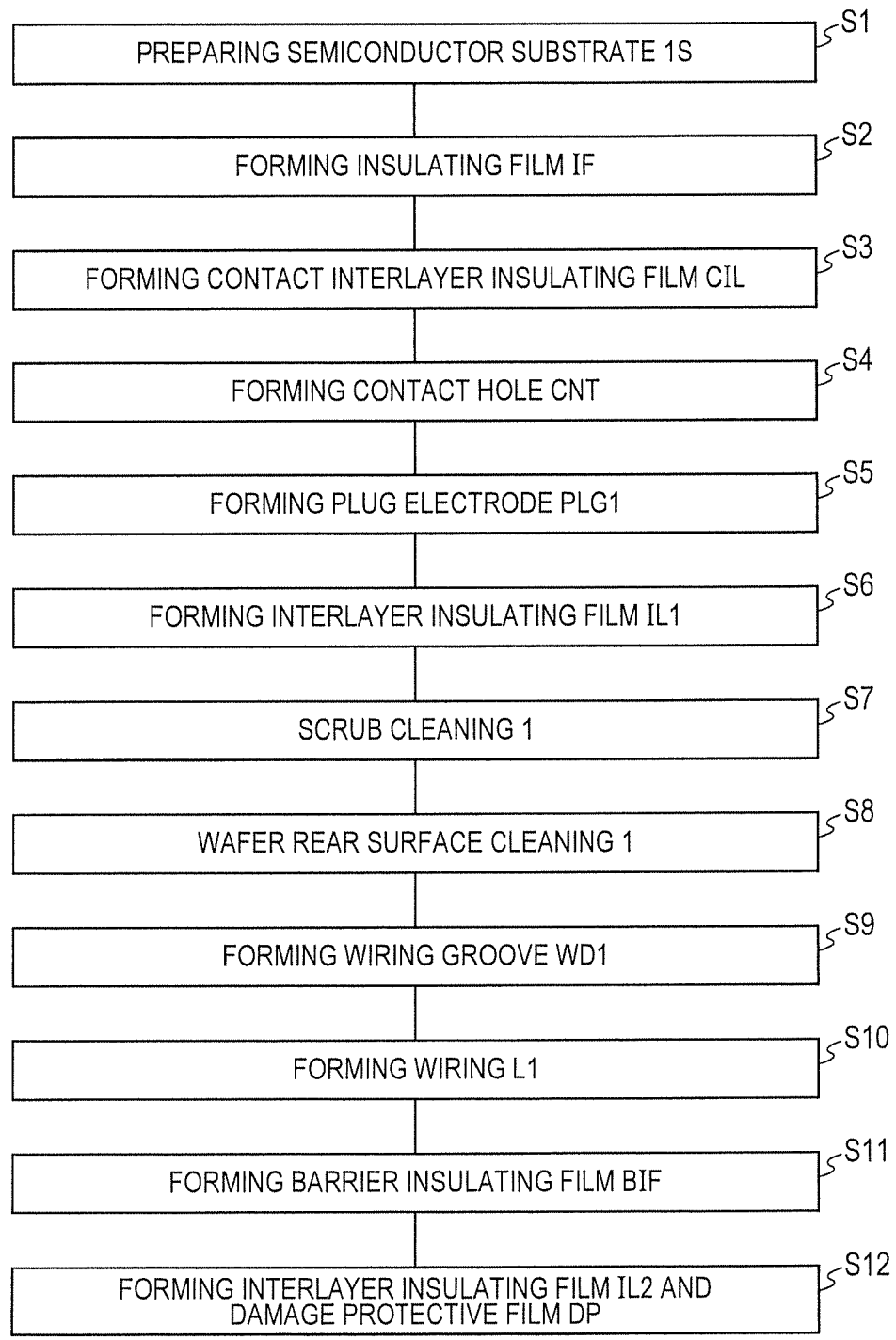
FIG. 1 is a flowchart showing a part of the manufacturing process of a semiconductor device.

The following embodiments will be described, if necessary, for the sake of convenience, divided into a plurality of sections or embodiments; except for the specified case, they are mutually related to each other and one is a part or the whole of the other modified example, details, and additional description. In the following description, when referring to the number of elements (including the number of units, numeric value, amount, range), except for the case particularly specified and the case of apparently restricted to a specified number in principle, they are not restricted to the specified number but may be more or less than the specified number. Further, in the following embodiments, it is needless to say that the component elements (including the element step) are not always required, except for the case particularly specified and the case apparently required in principle. Similarly, in the following embodiments, when referring to the shape and the positional relation of the component elements, they are to include their similar or like shapes, except for the case particularly specified and the case apparently different in principle. This is true to the above number and the range.

Hereinafter, the embodiments will be described in detail with reference to the drawings. In all the drawings for describing the embodiments, the same reference numerals and symbols are attached to the materials having the same functions and their repeated description is omitted. Further, in the following embodiments, the description about the same or similar portion is not repeated except for the case especially required.

In the drawings used for the embodiments, even if in a cross-sectional view, hatching may be sometimes omitted for the sake of simplicity. On the contrary, even if in a plan view, hatching may be performed for the sake of easy understanding of the view.

Embodiment

A semiconductor device according to an embodiment includes a plurality of Meta Insulator Semiconductor Field Effect Transistors (MISFET). The MISFETs include n-type MISFET Qn and p-type MISFET Qp. A semiconductor device is formed in a rectangular chip region and a plurality of chip regions are arranged on the semiconductor wafer in a matrix shape. A plurality of semiconductor devices are formed on one semiconductor wafer.

Figure 2:
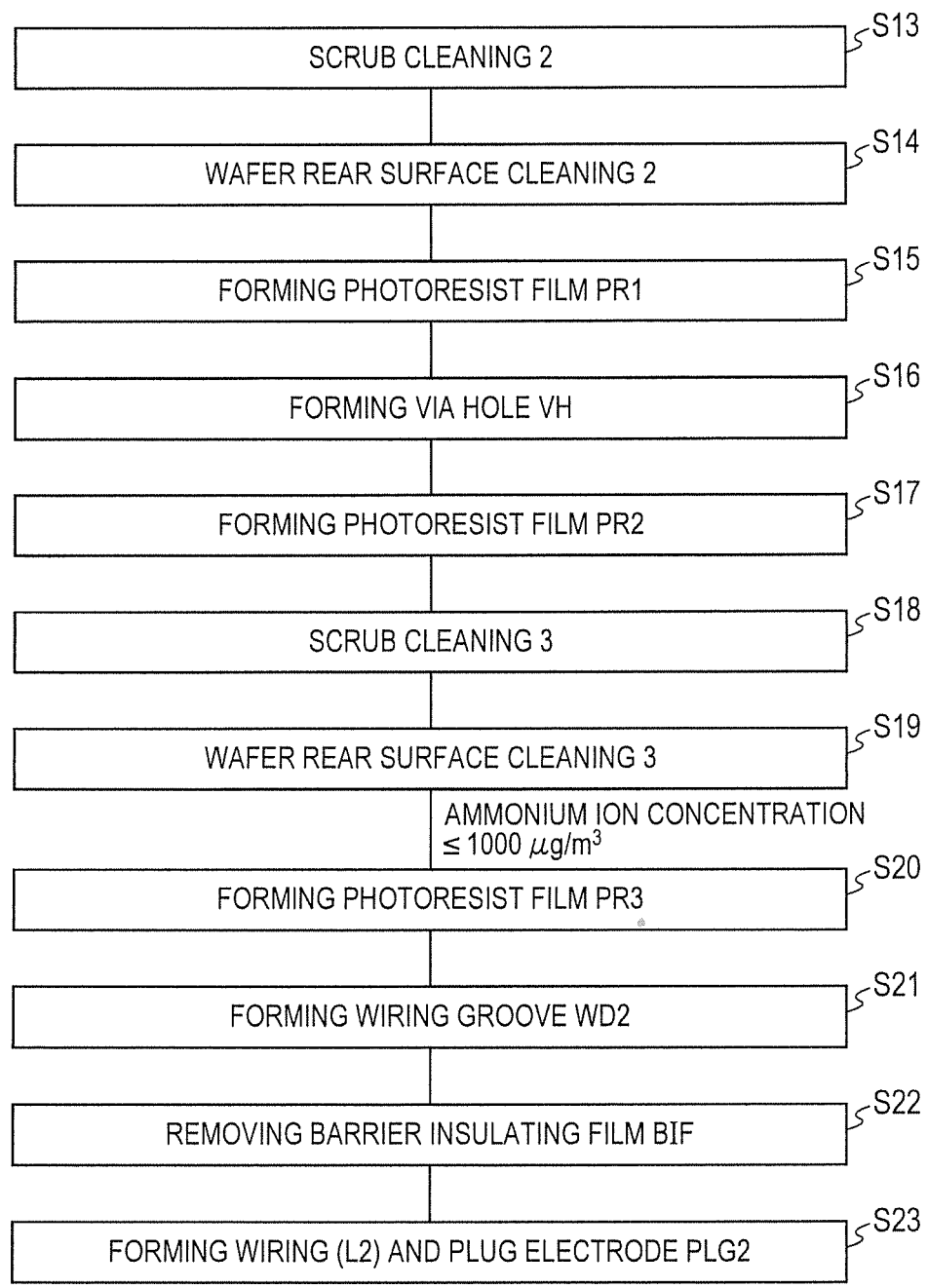
FIG. 2 is a flow chart showing a part of the manufacturing process of a semiconductor device following FIG. 1.
Figure 19:
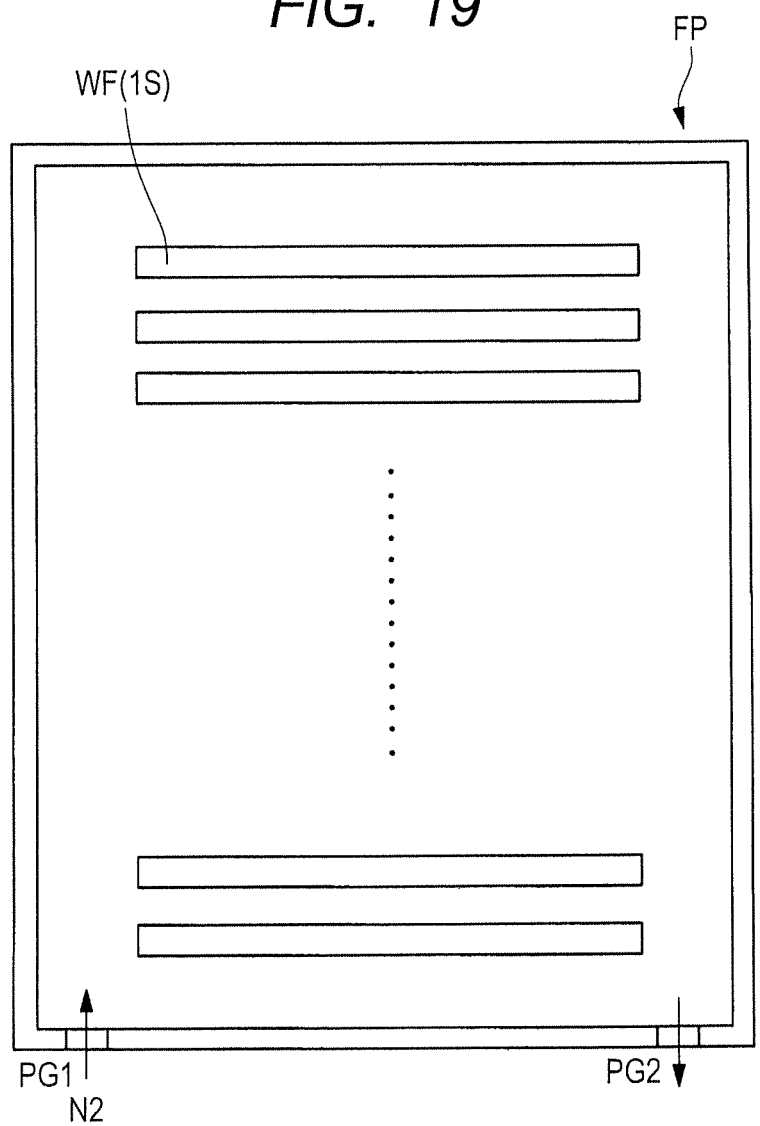
FIG. 19 is a cross-sectional view showing the stored state of a semiconductor device in the manufacturing processes.
Figure 20:
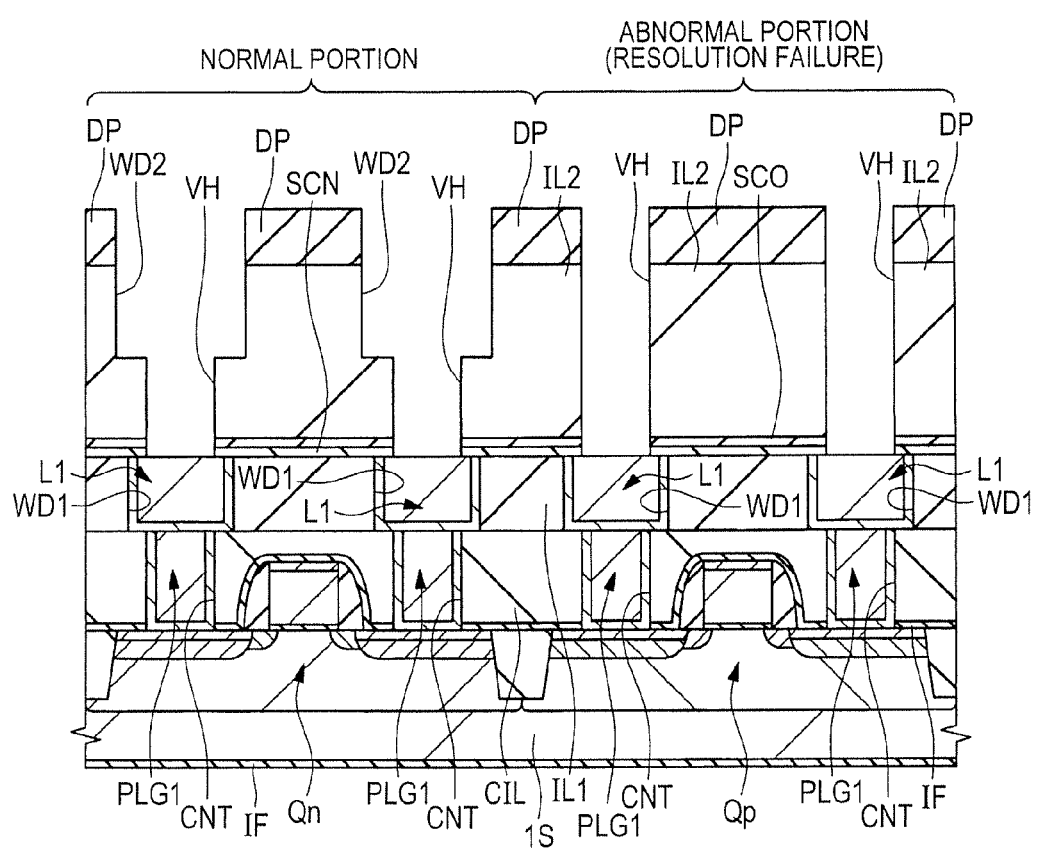
FIG. 20 is a cross-sectional view of an important portion showing the manufacturing process of a semiconductor device according to a considered example.

FIGS. 1 and 2 are flow views showing a part of the manufacturing process of a semiconductor device, and FIGS. 3 to 18 are cross-sectional views of an important portion showing the manufacturing process of a semiconductor device. FIG. 19 is a view showing the stored state among the manufacturing processes of a semiconductor device. FIG. 20 is a cross-sectional view of an important portion showing the manufacturing process of a semiconductor device in a considered example.

Figure 3:
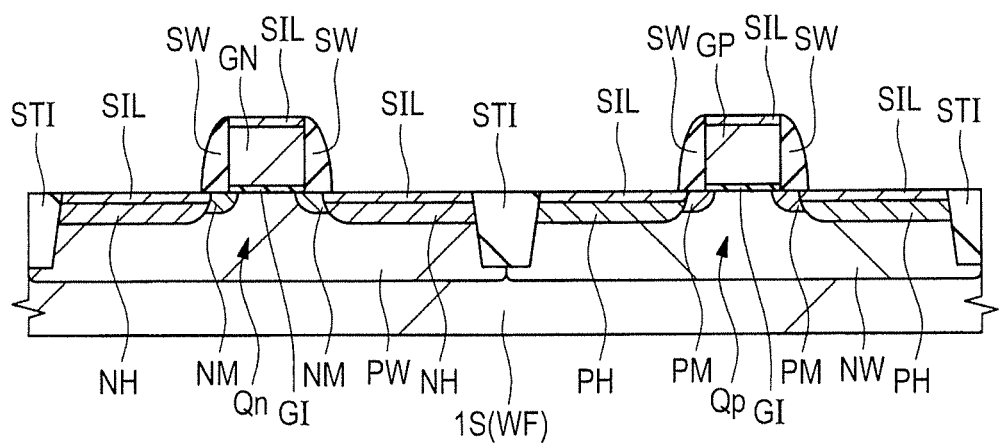
FIG. 3 is a cross-sectional view of an important portion showing the manufacturing process of a semiconductor device.

At first, as shown in FIG. 3, a semiconductor substrate 1S (semiconductor wafer WF), for example, made of silicon is prepared (Step S1 in FIG. 1). In the embodiment, although the description is made using the word "semiconductor substrate 1S", it can be replaced with the word "semiconductor wafer WF". The word of the semiconductor wafer WF is sometimes used here. The semiconductor substrate 1S includes a main surface and a rear surface and the plan shape is circular (substantially circular). The main surface and the rear surface of the semiconductor substrate 1S are circular. As shown in FIG. 3, the semiconductor substrate 1S has an n-type MISFET Qn and a p-type MISFET Qp. For example, on the surface (main surface) of the p-type semiconductor substrate 1S, a p-type well layer PW that is a p-type semiconductor region and an n-type well layer NW that is an n-type semiconductor region are formed. Actually, within the p-type well layer PW, a plurality of n-type MISFETs Qn are formed and within the n-type well layer NW, a plurality of p-type MISFETs Qp are formed. On the surface of the semiconductor substrate 1S, an element isolation film STI made of a silicon oxide film is formed to electrically isolate the n-type MISFETs Qn and the p-type MISFETs Qp, or the n-type MISFET Qn and the p-type MISFET Qp.

The n-type MISFET Qn includes a gate electrode GN formed on the main surface of the semiconductor substrate 1S through the gate insulating film GI and a source region and drain region formed on the main surface of the semiconductor substrate 1S at the both ends of the gate electrode GN. Each of the source region and the drain region includes an n-type low concentration semiconductor layer NM and an n-type high concentration semiconductor layer NH, and a silicide layer SIL is formed on the surface of the n-type high concentration semiconductor layer NH. The silicide layer SIL is formed also on the surface of the gate electrode GN. A sidewall insulating film SW is formed on the sidewall of the gate electrode GN. The n-type low concentration semiconductor layer NM and the n-type high concentration semiconductor layer NH are in the n-type semiconductor region and the n-type high concentration semiconductor layer NH is higher than the n-type low concentration semiconductor layer NM in the dopant concentration.

Further, the p-type MISFET Qp includes a gate electrode GP formed on the main surface of the semiconductor substrate 1S through the gate insulating film GI and a source region and drain region formed on the main surface of the semiconductor substrate 1S at the both ends of the gate electrode GP. Each of the source region and the drain region includes a p-type low concentration semiconductor layer PM and a p-type high concentration semiconductor layer PH, and the silicide layer SIL is formed on the surface of the p-type high concentration semiconductor layer PH. Further, the silicide layer SIL is formed on the surface of the gate electrode GP. Further, the sidewall insulating film SW is formed on the sidewall of the gate electrode GP. The p-type low concentration semiconductor layer PM and the p-type high concentration semiconductor layer PH are in the p-type semiconductor region and the p-type high concentration semiconductor layer PH is higher than the p-type low concentration semiconductor layer PM in the dopant concentration.

The silicide layer SIL of the n-type MISFET Qn and the p-type MISFET Qp is made of cobalt silicide (CoSi), titanium silicide (TiSi), nickel silicide (NiSi), or platinum containing nickel silicide (PtNiSi). The sidewall insulating film SW is formed by a silicon nitride film, or a stacked film including a silicon oxide film and a silicon nitride film.

Figure 4:
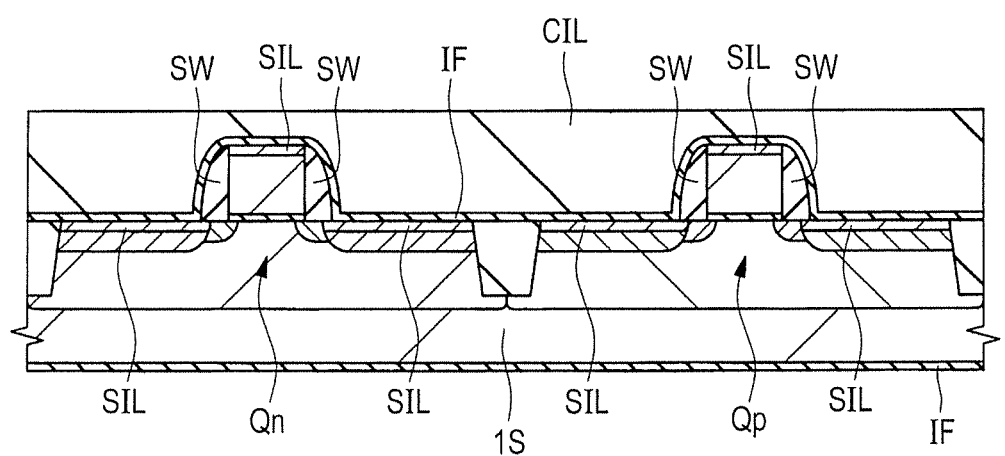
FIG. 4 is a cross-sectional view of the important portion showing the manufacturing process of a semiconductor device following FIG. 3.

Next, as shown in FIG. 4, an insulating film IF is formed over the semiconductor substrate 1S (Step S2 in FIG. 1). The insulating film IF is formed to cover the n-type MISFET Qn and the p-type MISFET Qp. Specifically, it is formed to cover the silicide layers SIL of the n-type MISFET Qn and the p-type MISFET Qp and the sidewall insulating films SW. The insulating film IF is formed of a silicon nitride film according to the LPCVD method with dichlorsilane ($SiH_2Cl_2$) and ammonia ($NH_3$) used as a source gas. By using the LPCVD method, a silicon nitride film can be a film of high covering property and high density. Further, as the insulating film IF, a silicon nitride film having tensile stress or compression stress can be also used. When the insulating film IF (silicon nitride film) is formed according to the LPCVD method, the silicon nitride film is also formed on the rear surface of the semiconductor substrate 1S.

As shown in FIG. 4, a contact interlayer insulating film CIL is formed on the insulating film IF on the side of the main surface of the semiconductor substrate 1S (Step S3 in FIG. 1). The contact interlayer insulating film CIL is formed of a silicon oxide film with a film thickness more than the insulating film IF, according to the Plasma-Enhanced Chemical Vapor Deposition (PECVD) method (plasma CVD method). When using the plasma CVD method, since film formation is performed with the rear surface of the semiconductor substrate 1S mounted on a stage, any contact interlayer insulating film CIL is not formed on the rear surface of the semiconductor substrate 1S but the insulating film IF (silicon nitride film) is exposed on the rear surface of the semiconductor substrate 1S.

Figure 5:
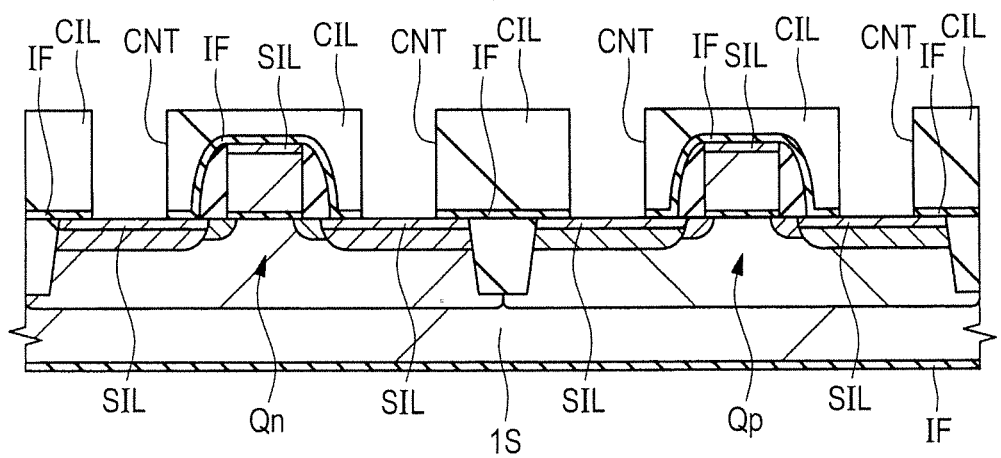
FIG. 5 is a cross-sectional view of the important portion showing the manufacturing process of a semiconductor device following FIG. 4.

Next, as shown in FIG. 5, by using the photolithography technique and the etching technique, a contact hole CNT is formed in the contact interlayer insulating film CIL and the insulating film IF. This contact hole CNT is processed to penetrate the contact interlayer insulating film CIL and the insulating film IF and arrive at the silicide layer SIL formed on the surface of the source region and the drain region of the n-type MISFET Qn and the p-type MISFET Qp. In the forming process of the contact hole CNT, under the condition that the etching rate of the contact interlayer insulating film CIL is higher, as for the insulating film IF, the contact hole CNT is formed in the contact interlayer insulating film CIL, and thereafter etching is performed under the condition that the insulating film IF is etched. In short, the insulating film IF works as an etching stopper. By making the insulating film IF of a silicon nitride film formed according to the LPCVD method, an etching selection ratio to the contact interlayer insulating film CIL can be fully enhanced.

Figure 6:
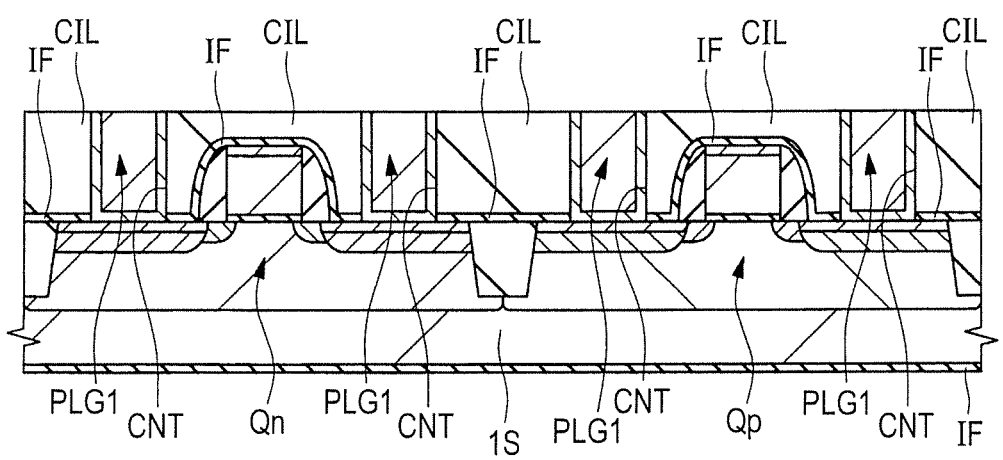
FIG. 6 is a cross-sectional view of the important portion showing the manufacturing process of a semiconductor device following FIG. 5.

Next, as shown in FIG. 6, by embedding a metal film in the contact hole CNT formed in the contact interlayer insulating film CIL, a plug PLG1 is formed (Step S4 in FIG. 1). Specifically, a titanium/titanium nitride film as a barrier conductor film is formed on the contact interlayer insulating film CIL with the contact hole CNT formed there, for example, according to the sputtering method. A tungsten film is formed on the titanium/titanium nitride film. According to this, the titanium/titanium nitride film is formed in the inner wall (sidewall and bottom) of the contact hole CNT, and a tungsten film is formed on the titanium/titanium nitride film to fill the contact hole CNT. Thereafter, only the unnecessary titanium/titanium nitride film and tungsten film formed on the contact interlayer insulating film CIL is removed according to the Chemical Mechanical Polishing (CMP) method. This can form the plug PLG1 having the titanium/titanium nitride film and the tungsten film embedded only within the contact hole CNT. The titanium/titanium nitride film and the tungsten film are not formed on the side of the rear surface of the semiconductor substrate 1S.

Figure 7:
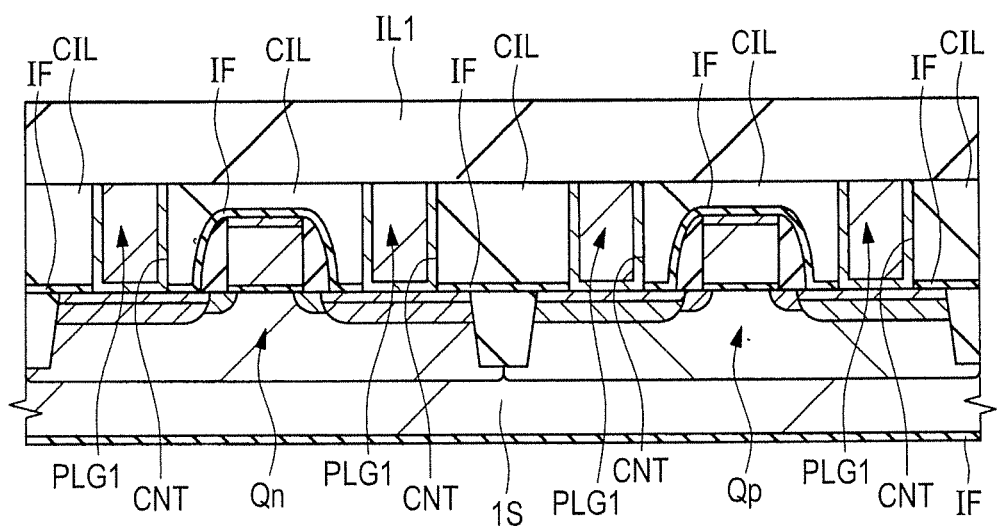
FIG. 7 is a cross-sectional view of the important portion showing the manufacturing process of a semiconductor device following FIG. 6.

As shown in FIG. 7, an interlayer insulating film IL1 is formed on the contact interlayer insulating film CIL with the plug PLG1 formed there (Step S6 in FIG. 1). This interlayer insulating film IL1 is formed of, for example, a silicon oxide film, for example, according to the plasma CVD method.

Next, before forming a wiring groove WD1 described later, scrub cleaning 1 is performed on the main surface and the rear surface of the semiconductor substrate 1S (Step S7 in FIG. 1). In the scrub cleaning 1, a rotary blush is operated while running pure water on the main surface and the rear surface of the semiconductor substrate 1S, hence to remove the fine particle (debris) attached to the main surface and the rear surface.

Next, wafer rear surface cleaning 1 is performed on the rear surface of the semiconductor substrate 1S (Step S8 in FIG. 1). In the process of the wafer rear surface cleaning 1, Sulfuric acid Peroxide Mixture (SPM) cleaning and Fluoride acid Peroxide Mixture (FPM) cleaning are performed in this order. The wafer rear surface cleaning 1 is performed only on the rear surface of the semiconductor substrate 1S, in a way of avoiding the cleaning liquid from intruding into the main surface of the semiconductor substrate 1S. The SPM cleaning is to remove an organic substance, using the mixed liquid of sulfuric acid and hydrogen peroxide. Further, the FPM cleaning is to remove metal contamination, using the mixed liquid of hydrofluoric acid and hydrogen peroxide. Here, instead of the SPM cleaning, Ammonia-Hydrogen Peroxide Mixture (APM) cleaning may be used, or instead of the FPM cleaning, Diluted Hydrofluoric acid (DHF) cleaning may be used. The APM cleaning is to remove the organic substance using the mixed liquid of ammonia and hydrogen peroxide, and the DHF cleaning is to remove the metal contamination using the mixed liquid of hydrofluoric acid and hydrogen peroxide. The FPM cleaning and the DHF cleaning are to remove the oxide film and can remove the metal attached to the oxide film together with the oxide film. Alternatively, the metal intruded into the oxide film can be removed by being suspended. Here, the SPM cleaning and the FPM cleaning can avoid a so-called cross contamination.

Figure 8:
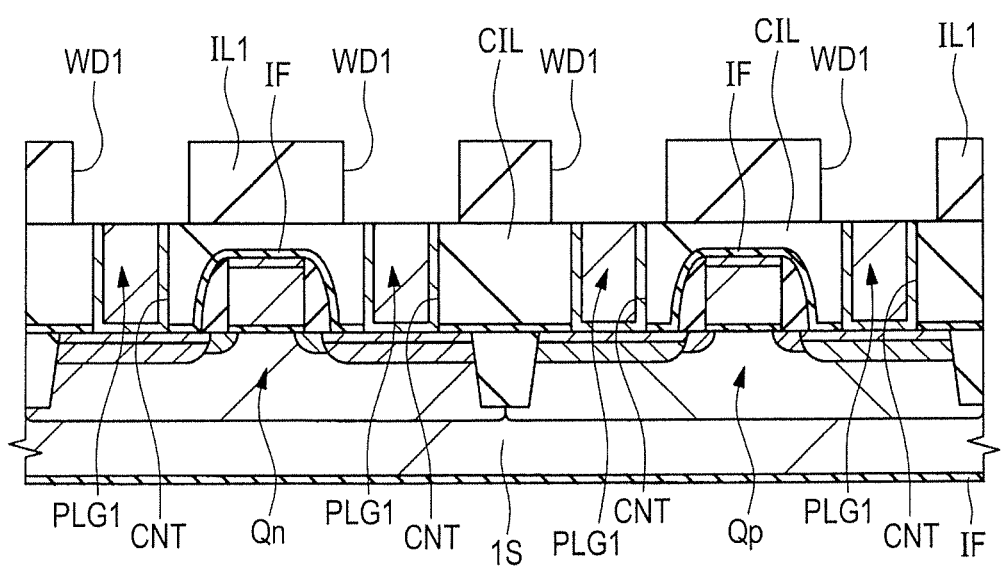
FIG. 8 is a cross-sectional view of the important portion showing the manufacturing process of a semiconductor device following FIG. 7.

As shown in FIG. 8, by using the photolithography technique and the etching technique, a wiring groove WD1 is formed in the interlayer insulating film IL1 (Step S9 in FIG. 1). The wiring groove WD1 is formed so that it may penetrate the interlayer insulating film IL1 made of a silicon oxide film and arrive at the contact interlayer insulating film CIL in its bottom surface. According to this, the surface (top surface) of the plug PLG1 is exposed in the bottom of the wiring groove WD1.

Figure 9:
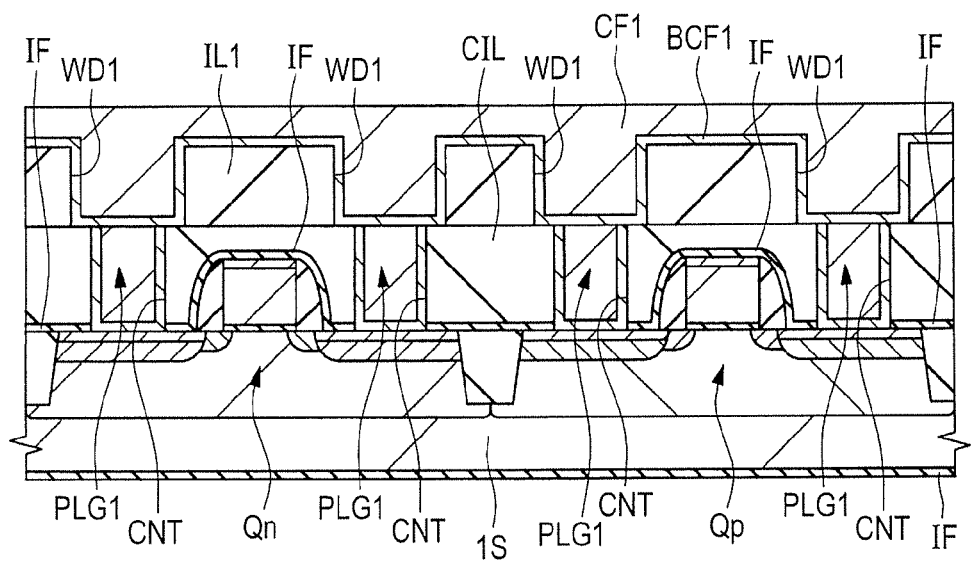
FIG. 9 is a cross-sectional view of the important portion showing the manufacturing process of a semiconductor device following FIG. 8.
Figure 10:
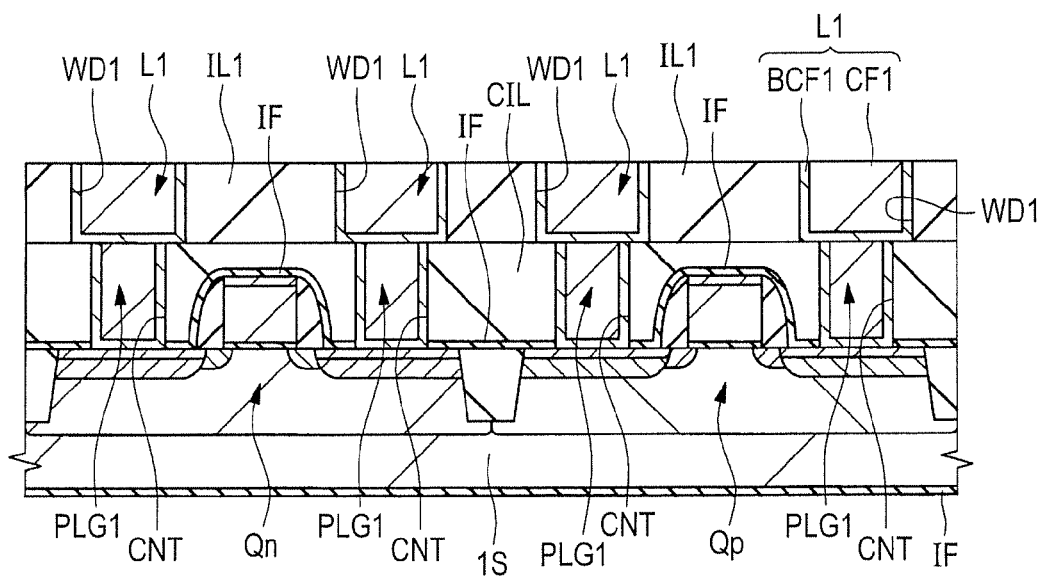
FIG. 10 is a cross-sectional view of the important portion showing the manufacturing process of a semiconductor device following FIG. 9.

As shown in FIG. 10, a wiring L1 is formed within the wiring groove WD1 (Step S10 in FIG. 1). At first, as shown in FIG. 9, a barrier conductor film (copper diffusion prevention film) BCF1 is formed on the interlayer insulating film IL1 with the wiring groove WD1 formed there. Specifically, the barrier conductor film BCF1 is made of tantalum (Ta), titanium (Ti), ruthenium (Ru), tungsten (W), manganese (Mn), their nitride, their silicide nitride, or their stacked film, for example, according to the sputtering method.

Continuously, for example, a seed film made of a thin copper film is formed on the barrier conductor film BCF1 formed inside the wiring groove WD1 and on the interlayer insulating film IL1, according to the sputtering method. Then, a copper film CF1 is formed according to the electrolytic plating method with the seed film used as an electrode. The copper film CF1 is formed in a stacked structure of the seed film and a plating film. The copper film CF1 is formed in a way of filling the wiring groove WD1. The copper film CF1 is formed of a film mainly including, for example, copper. Specifically, it is formed of copper (Cu) or copper alloy (alloy of copper (Cu) and aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), In (indium), lanthanide metal, or actinoid-based metal). In the case of the copper alloy, since the seed film is the alloy as mentioned above, the copper film CF1 becomes the copper alloy. The copper alloy described later is similarly made.

The barrier conductor film BCF1, the seed film, and the copper film CF1 are not formed on the rear surface of the semiconductor substrate 1S.

Continuously, as shown in FIG. 10, the unnecessary barrier conductor film BCF1 and copper film CF1 formed on the interlayer insulating film IL1 are removed according to the CMP method. According to this, the wiring L1 with the barrier conductor film BCF1 and the copper film CF1 embedded into the wiring groove WD1 can be formed. The barrier conductor film BCF1 and the copper film CF1 between the wirings L1 are removed by the CMP method and the mutually adjacent wirings L1 are electrically isolated. In short, the main surface of the interlayer insulating film IL1 positioned between the adjacent wirings L1 is exposed according to the CMP method.

Continuously, the ammonia plasma treatment is performed on the surface of the interlayer insulating film IL1 with the wiring L1 formed there, to clean the surface of the wiring L1 and the surface of the interlayer insulating film IL1.

Figure 11:
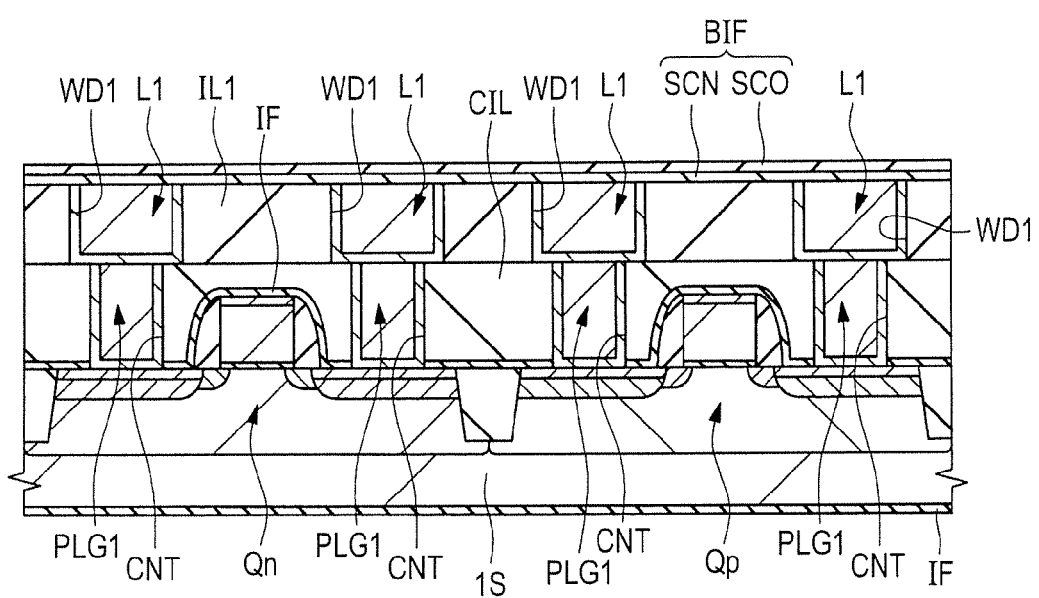
FIG. 11 is a cross-sectional view of the important portion showing the manufacturing process of a semiconductor device following FIG. 10.

Next, as shown in FIG. 11, a barrier insulating film BIF is formed on the wiring L1 and the interlayer insulating film IL1 (Step S11 in FIG. 1). The barrier insulating film BIF is made by a stacked film of an SiCN film SCN and an SiCO film SCO. The SiCN film SCN is formed on the wiring L1 and the interlayer insulating film IL1 according to the plasma CVD method with the tetramethyl silane gas and the ammonia gas used as the material gas. The SiCN film SCN is a copper diffusion prevention film of the copper film CF1 forming the wiring L1. According to the above mentioned ammonia plasma treatment, adhesion between the SiCN film SCN and the interlayer insulating film LI1 is improved and Time Dependent Dielectric Breakdown (TDDB) characteristic between the adjacent wirings L1 is improved. In short, a leak current between the adjacent wirings L1 can be reduced.

Further, the SiCO film SCO can be formed, for example, according to the plasma CVD method. The SiCO film SCO is provided in order to avoid the nitrogen or ammonium ion included in the SiCN film SCN from diffusing to a photoresist film PR3 described later. In short, the SiCO film SCO is to avoid the resist poisoning caused by the inactiveness of the photoresist film PR3 in the photolithography process.

Any SiCN film SCN and SiO film SCO are not formed (deposited) on the rear surface of the semiconductor substrate 1S.

Figure 12:
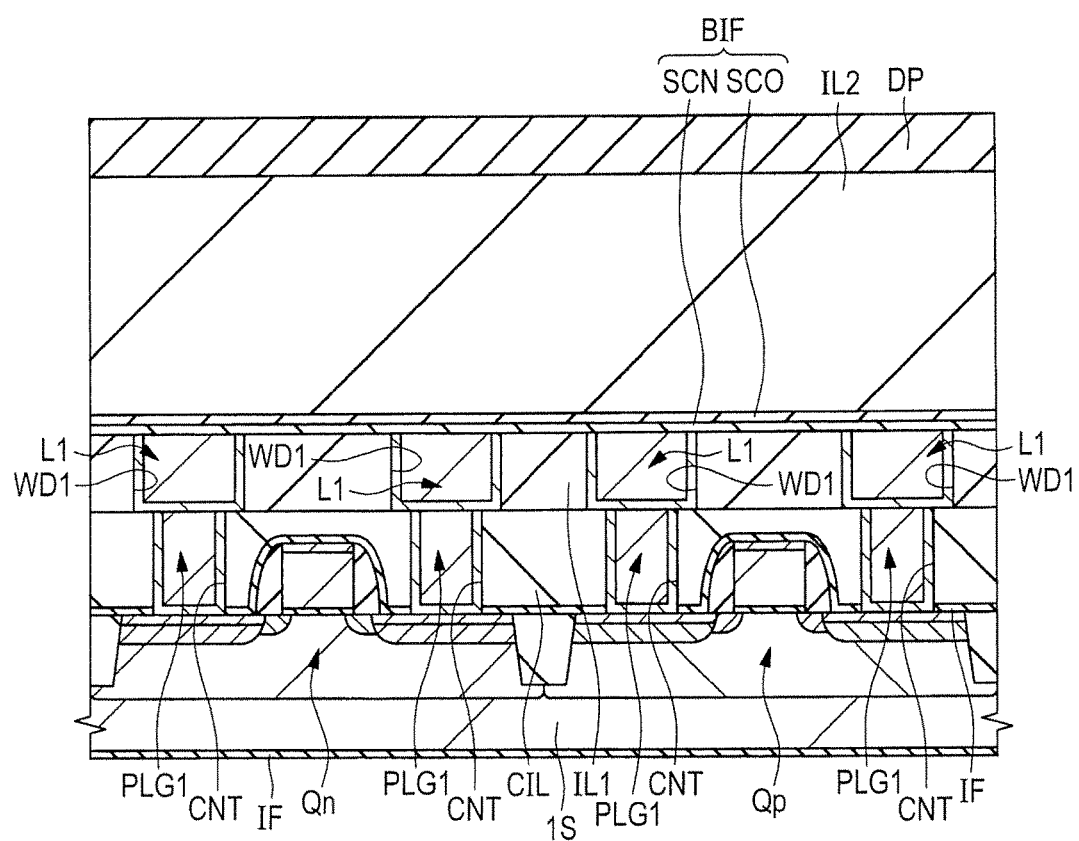
FIG. 12 is a cross-sectional view of the important portion showing the manufacturing process of a semiconductor device following FIG. 11.

Next, as shown in FIG. 12, an interlayer insulating film IL2 is formed on the barrier insulating film BIF and a damage protective film DP is formed on the interlayer insulating film IL2 (Step S12 in FIG. 1). More specifically, the interlayer insulating film IL2 is formed of, for example, an SiOC film having holes of lower dielectric constant than the silicon oxide film, an HSQ film having holes, or an MSQ film having holes. The SiOC film having the holes can be formed, for example, using the plasma CVD method. The damage protective film DP is formed of, for example, a tetra ethyl ortho silicate (TEOS) film, or a silicon oxide film, for example, according to the plasma CVD method. The damage protective film DP is higher than the interlayer insulating film IL2 in film density and mechanical intensity.

Next, before forming a photoresist film PR1 described later, scrub cleaning 2 is performed on the main surface and the rear surface of the semiconductor substrate 1S (Step S13 in FIG. 2). The scrub cleaning 2 is performed similarly to the above mentioned scrub cleaning 1.

This time, wafer rear surface cleaning 2 is performed on the rear surface of the semiconductor substrate 1S (Step S14 in FIG. 2). The wafer rear surface cleaning 2 is performed similarly to the wafer rear surface cleaning 1.

Figure 13:
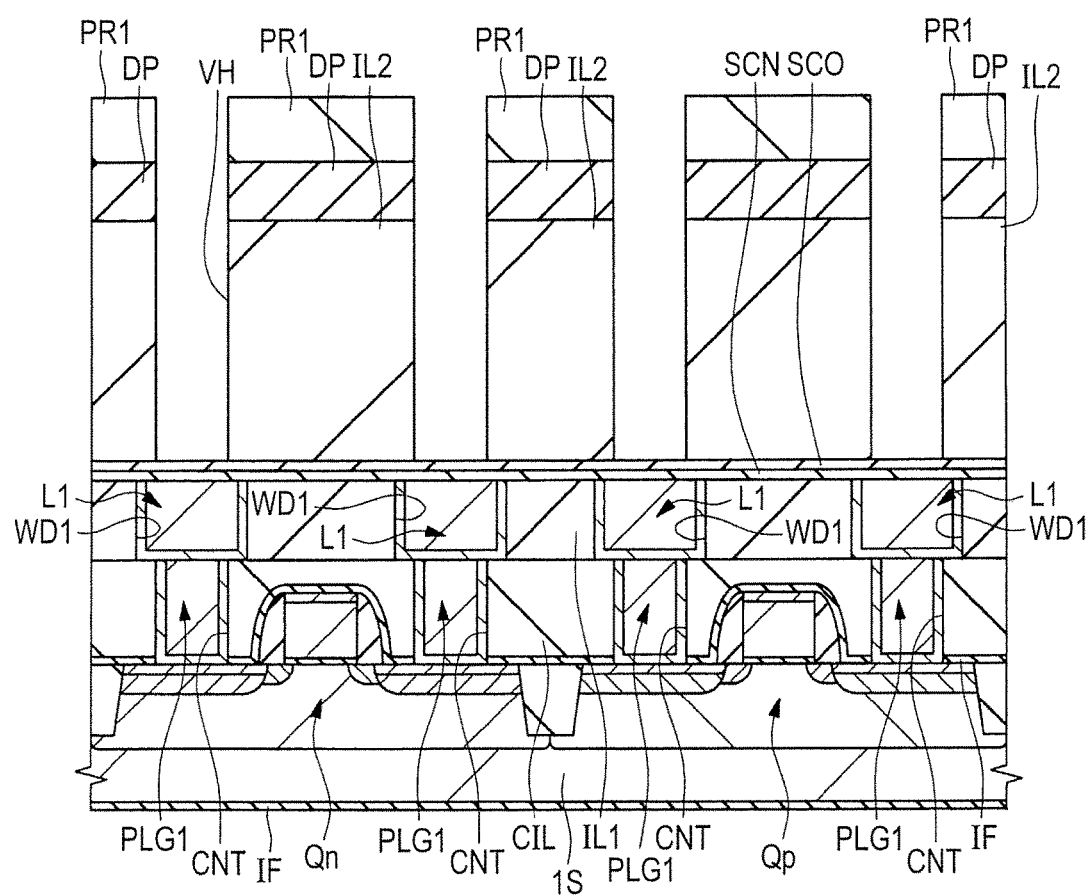
FIG. 13 is a cross-sectional view of the important portion showing the manufacturing process of a semiconductor device following FIG. 12.

As shown in FIG. 13, a photoresist film PR1 made of a chemical amplification type resist is formed on the damage protective film DP (Step S15 in FIG. 2). The chemical amplification type resist is applied to the damage protective film DP and by performing the exposure and development treatment, the chemical amplification type resist is patterned to form the photoresist film PR1. The patterning is performed to bore each region to form a via hole VH. Thereafter, with a mask of the patterned photoresist film PR1, the damage protective film DP and the interlayer insulating film IL2 are etched. Thus, the via holes VH to expose the SiCO film SCO are formed by penetrating the damage protective film DP and the interlayer insulating film IL2 (Step S16 in FIG. 2). This SiCO film SCO works as the etching stopper in the etching.

Figure 14:
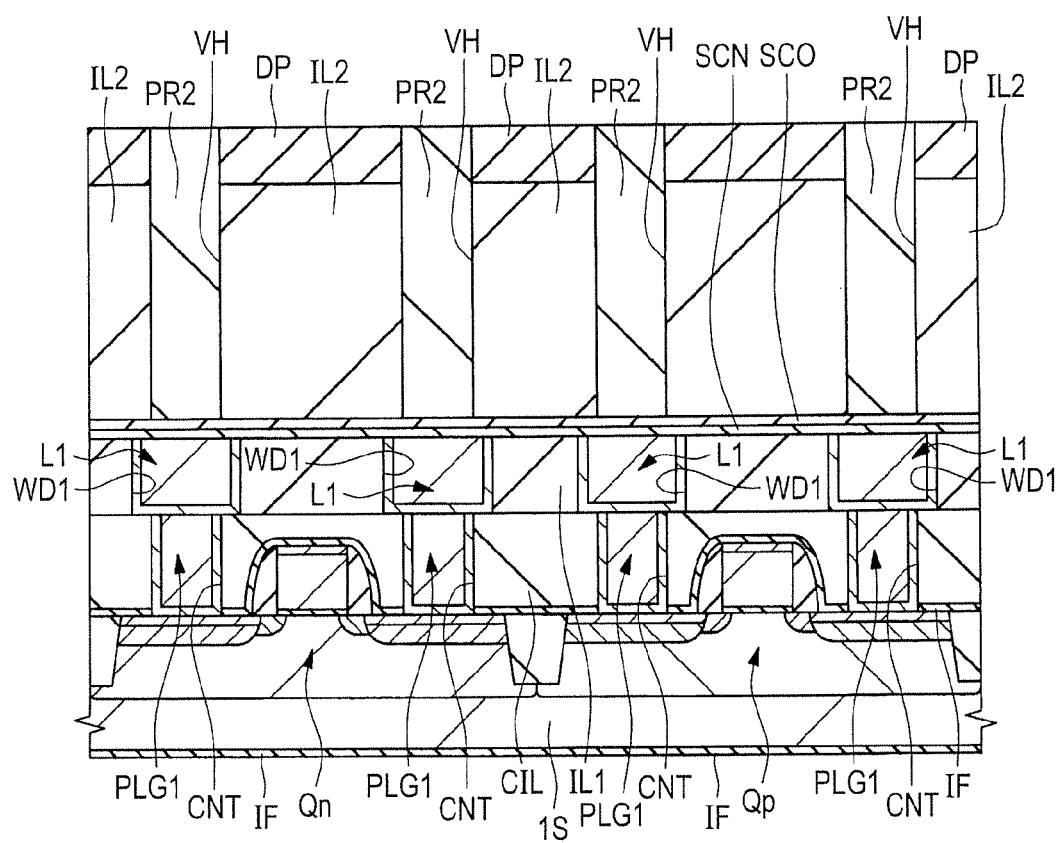
FIG. 14 is a cross-sectional view of the important portion showing the manufacturing process of a semiconductor device following FIG. 13.

Next, as shown in FIG. 14, a via-fill PR2 (via-fill film PR2) is formed only within the via hole VH (Step S17 in FIG. 2). The via-fill PR2 is an organic film made of the substantially same material as that of the photoresist films PR1 and PR3 and can be removed according to the plasma ashing treatment. At first, the via-fill PR2 is formed over the semiconductor substrate 1S to completely fill the via hole VH, and the via-fill PR2 is formed within the via hole VH and on the damage protective film DP. Next, the plasma ashing treatment is performed on the via-fill PR2, using a gas such as ozone ($O_3$) or oxygen ($O_2$), and the via-fill PR2 for the same film thickness as the via-fill PR2 on the damage protective film DP is selectively removed through the plasma ashing treatment. Here, the via-fill PR2 on the damage protective film DP is completely removed but the plasma ashing treatment does not affect the via-fill PR2 within the via hole VH and it is important to selectively leave the via-fill PR2 within the via hole VH.

In the above mentioned forming process of the photoresist film PR1 and the via-fill PR2, the photoresist film PR1 and the via-fill PR2 are not formed on the rear surface of the semiconductor substrate 1S. Since the plasma asking treatment is performed in a state where the rear surface of the semiconductor substrate 1S is exposed, the surface of the silicon nitride film formed on the rear surface of the semiconductor substrate 1S is oxidized, to form a natural oxide.

Before a photoresist film PR3 described later is formed, scrub cleaning 3 is performed on the main surface and the rear surface of the semiconductor substrate 1S (Step S18 in FIG. 2). The scrub cleaning 3 is performed similarly to the above mentioned scrub cleaning 1.

Next, wafer rear surface cleaning 3 is performed on the rear surface of the semiconductor substrate 1S (Step S19 in FIG. 2). The wafer rear surface cleaning 3 is performed similarly to the wafer rear surface cleaning 1. In the SPM cleaning process of the wafer rear surface cleaning 3, the surface of the silicon nitride film formed on the rear surface of the semiconductor substrate 1S is oxidized to form a natural oxide, and thereafter, when the FPM cleaning is performed, the natural oxide (oxide film) on the surface of the silicon nitride film is removed and the surface of the silicon nitride film gets into an exposed state.

Figure 15:
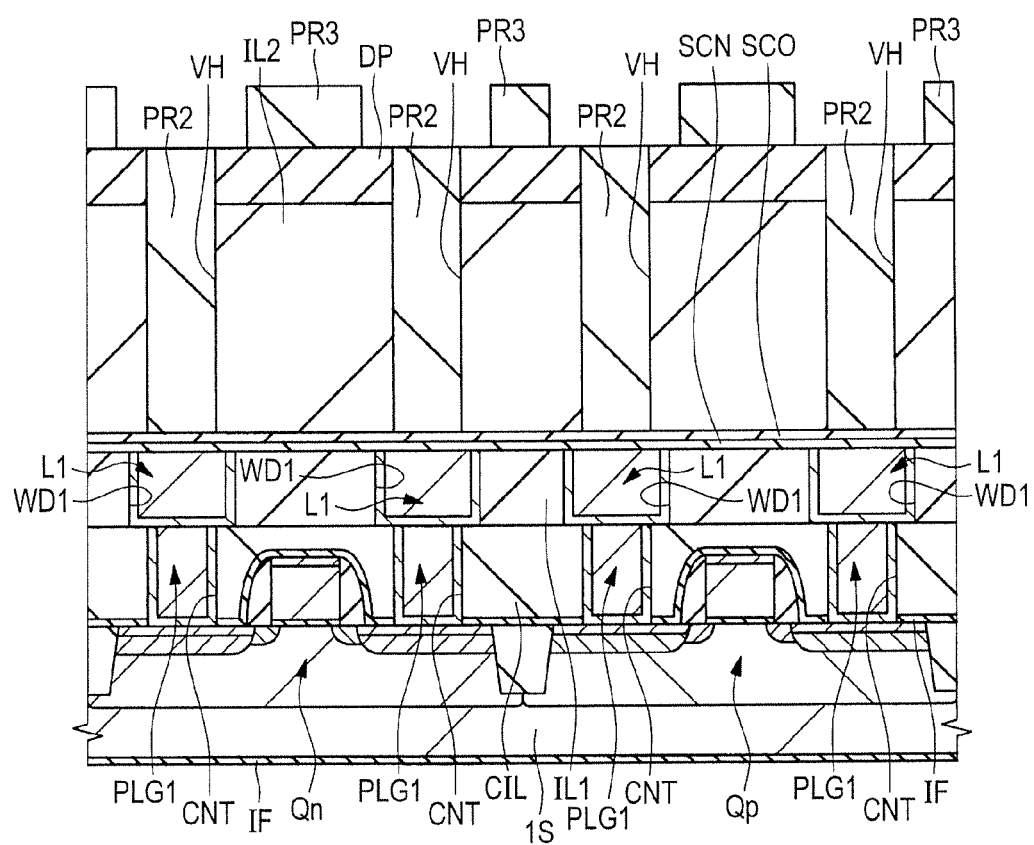
FIG. 15 is a cross-sectional view of the important portion showing the manufacturing process of a semiconductor device following FIG. 14.

Next, as shown in FIG. 15, a photoresist film PR3 as a mask for forming a wiring groove WD2 described later is formed on the damage protective film DP (Step S20 in FIG. 2). A positive chemical amplification type resist is applied to the via-fill PR2 within the via hole VH and on the damage protective film DP (application process), and a heating treatment before exposure is performed there to vaporize the organic solvent (heating process before exposure). Then, the exposure process is performed. Specifically, the region to form the wiring groove WD2 described later is irradiated with ultraviolet ray by an excimer laser. Then, when a heating treatment after exposure is performed on the chemical amplification type resist, deprotection reaction proceeds in the irradiated region of ultraviolet ray (exposure region) and into a molecular structure dissolvable into alkali developing solution (heating process after exposure). The chemical amplification type resist in the irradiated region is removed through the developing processing, hence to form the photoresist film PR3 having each aperture corresponding to each wiring groove WD2 described later (development process). Here, the wiring groove WD2 is formed on the via hole VH. In plan view, the via hole VH has a circular, the width of the wiring groove WD2 is the diameter of the via hole VH and more, and the length of the wiring groove WD2 is more (longer) than the diameter of the via hole VH.

Figure 16:
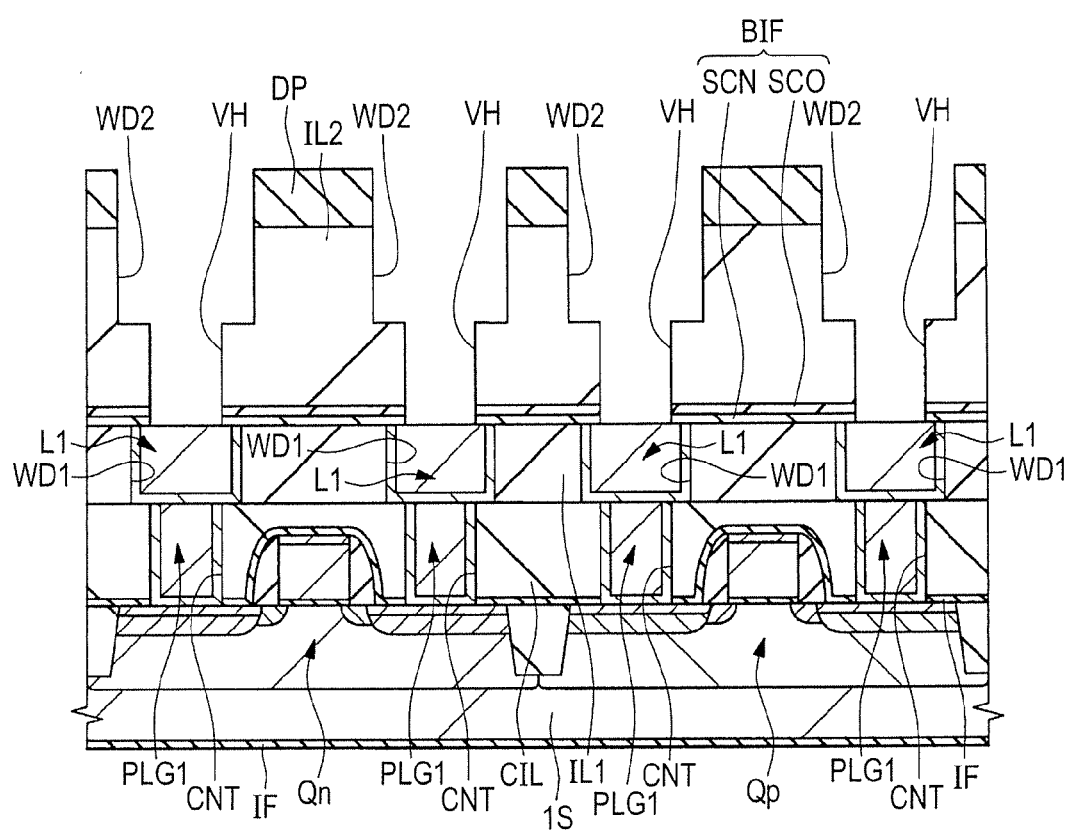
FIG. 16 is a cross-sectional view of the important portion showing the manufacturing process of a semiconductor device following FIG. 15.

Then, as shown in FIG. 16, using the etching technique, the wiring groove WD2 is formed on the interlayer insulating film IL2 and the damage protective film DP (Step S21 in FIG. 2). Specifically, the patterned photoresist film PR3 shown in FIG. 15 is used as a mask to perform the anisotropy dry etching and the respective wiring grooves WD2 are formed on the damage protective film DP and the interlayer insulating film IL2. Before application of the chemical amplification type resist, an anti-reflection film made of an organic film such as Bottom Antireflective Coating (BARC) may be provided on the damage protective film DP.

After forming the wiring groove WD2, the via-fills PR2 and PR3 are removed by the plasma ashing treatment. When provided with the anti-reflection film, the anti-reflection film is also removed by the plasma ashing treatment. Then, the barrier insulating film BIF exposed to the via hole VH is removed by the dry etching technique (Step S22 in FIG. 2), to expose the top surface of the wiring L1. The damage protective film DP as an insulating film having a higher density than the interlayer insulating film IL2 is provided on the interlayer insulating film IL2, which can avoid or decrease the following problems in the dry etching process. Specifically, when the damage protective film DP is not formed, there occur the following problems: since the dry etching treatment is performed on the surface of the interlayer insulating film IL2 having a low density, the surface of the interlayer insulating film IL2 gets rough, and since the surface is etched, the film thickness of the interlayer insulating film IL2 is decreased.

Figure 17:
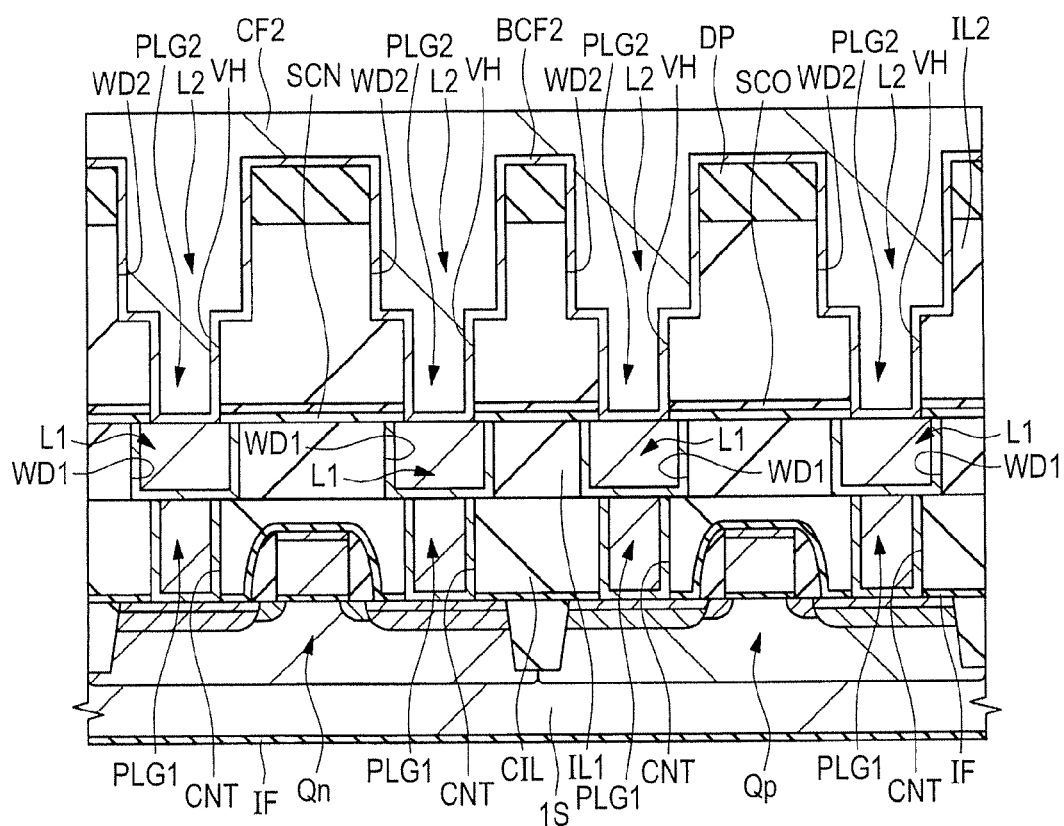
FIG. 17 is a cross-sectional view of the important portion showing the manufacturing process of a semiconductor device following FIG. 16.

As shown in FIG. 17, a barrier conductor film (copper diffusion protective film) BCF1 is formed inside the wiring groove WD2 and the via hole VH and on the damage protective film DP. Specifically, the barrier conductor film BCF1 is made of tantalum (Ta), titanium (Ti), ruthenium (Ru), tungsten (W), manganese (Mn), their nitride, their silicide nitride, or their stacked film, for example, according to the sputtering method. Continuously, for example, a seed film made of a thin copper film is formed on the barrier conductor film BCF2 formed inside the wiring groove WD2 and on the damage protective film DP, according to the sputtering method. Then, a copper film CF2 is formed with this seed film used as the electrode according to the electrolytic plating method. The copper film CF2 is formed in a stacked structure including the seed film and the plating film, to fill the wiring groove WD2. This copper film CF2 is formed of, for example, a film mainly including copper. Specifically, it is formed of copper (Cu) or copper alloy (alloy of copper (Cu) and aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), In (indium), lanthanide metal, or actinoid-based metal).

Figure 18:
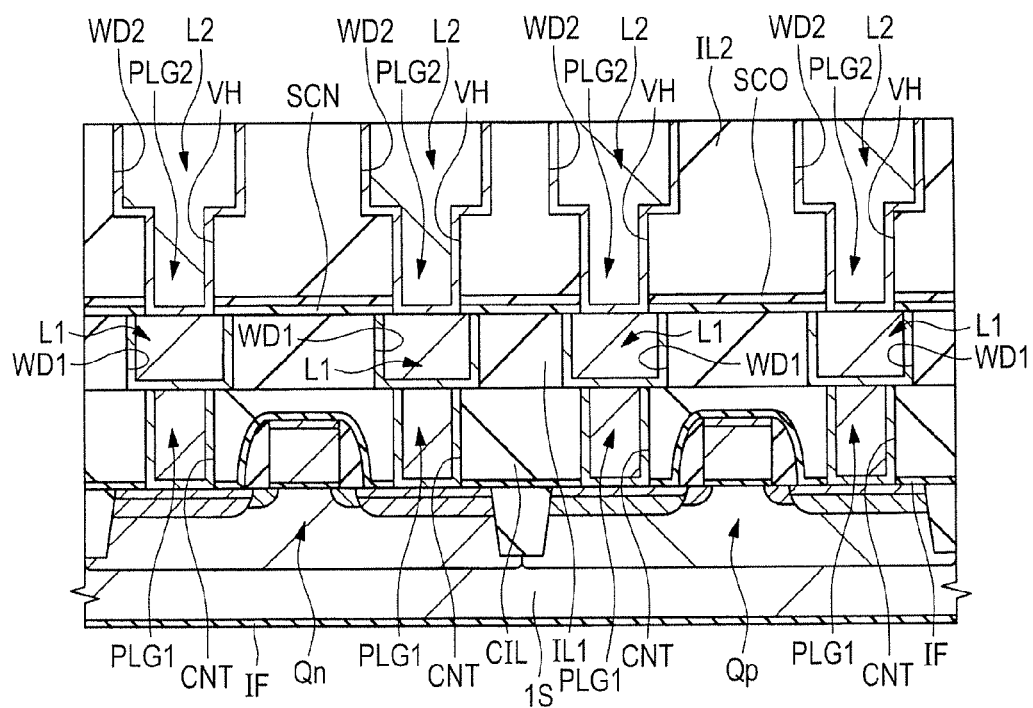
FIG. 18 is a cross-sectional view of the important portion showing the manufacturing process of a semiconductor device following FIG. 17.

As shown in FIG. 18, the unnecessary barrier conductor film BCF2 and copper film CF2 formed on the damage protective film DP are removed by the CMP method. Here, the damage protective film DP is also removed by the CMP method, a wiring L2 formed by embedding the barrier conductor film BCF2 and the copper film CF2 into the wiring groove WD2 and a plug electrode PLG2 formed by embedding the barrier conductor film BCF2 and the copper film CF2 into the via hole VH can be formed (Step S23 in FIG. 2). In other words, only the interlayer insulating film IL2 having a low dielectric constant is left between the wirings L2 and the parasitic capacitance between the adjacent wirings L2 can be reduced. By having provided with the damage protective film DP, the CMP polishing damage on the surface of the interlayer insulating film IL2 between the wirings L2 can be avoided (reduced) and a leak current between the wirings L2 can be reduced when removing the copper film CF2 and the barrier conductor film BCF2 according to the CMP polishing.

By repetition of the processes from Step S11 in FIG. 1 to Step S23 in FIG. 2, a multi layer wiring can be formed above the wiring L2.

During a period from the completion of the above mentioned wafer rear surface cleaning 3 (especially, the FPM cleaning) in Step S19 to the photoresist film PR3 formation process in Step S20, the semiconductor substrate 1S (semiconductor wafer WF) is accommodated in the sealed type transfer container FP including purge holes PG1 and PG2 shown in FIG. 19. The sealed type transfer container FP is the container capable of accommodating, for example, 24 sheets of semiconductor wafers having a diameter of 300 mm with a door (open-and-close window). In the closed state of the door, airtightness is kept inside the sealed type transfer container FP.

In the embodiment, it is important that the sealed type transfer container FP is purged with a nitrogen ($N_2$) gas, in order to keep the inside of the sealed type transfer container FP at a desired atmosphere. In other words, a nitrogen ($N_2$) gas is inserted into the sealed type transfer container FP through the purge hole PG1 and exhausted from the purge hole PG2, hence to keep (control) the concentration of ammonium ion ($NH_4^+$) inside the sealed type transfer container FP at 1000 $\mu g/m^3$ and less. As mentioned above, the semiconductor substrate 1S is carried among the processes, being accommodated into the sealed type transfer container FP; unless otherwise specified, the sealed type transfer container FP is not purged with the nitrogen ($N_2$) gas.

This time, a problem in the case of no control (no purge with nitrogen) performed on the concentration of the ammonium ion ($NH_4^+$) within the sealed type transfer container FP will be described.

As mentioned above, at a time of finishing the wafer rear surface cleaning 3 (especially, the FPM cleaning) in Step S19, the natural oxide (oxide film) on the surface of the silicon nitride film formed on the rear surface of the semiconductor substrate 1S is removed and the surface of the silicon nitride film is exposed. In other words, since the ammonium ion ($NH_4^+$) is constantly exhausted from the silicon nitride film, the concentration of the ammonium ion ($NH_4^+$) within the sealed type transfer container FP rises. The ammonium ion ($NH_4^+$) intrudes into the via-fill PR2 formed on the main surface of the semiconductor substrate 1S, to form amine. In short, the via-fill PR2 formed in the via hole VH in FIG. 14 contains a large amount of amine.

As mentioned above using FIG. 15, although a positive chemical amplification type resist is formed on the via-fill PR2 formed within the via hole VH, to form the photoresist film PR3 having opening portions corresponding to the respective wiring grooves WD2, the amine included in the via-fill PR2 is diffused and intruded into the chemical amplification type resist, hence to disturb the deprotection reaction in the exposure region and after the development process, a part of the chemical amplification type resist is left without being removed, although it is in the exposure region. Accordingly, when performing the anisotropy dry etching on the damage protective film DP and the interlayer insulating film IL2 with the photoresist film PR3 used as the mask, there is a problem that the original wiring groove WD2 is not formed, as shown in FIG. 20. Further, after removing the via-fill PR2 and the photoresist film PR3 by the plasma ashing treatment, there arises a problem that breaking occurs in the wiring L2 when forming the wiring L2 and the plug electrode PLG2 within the wiring groove WD2 and the via hole VH. In other words, because of the ammonium ion included in the silicon nitride film formed on the rear surface of the semiconductor substrate 1S, resist poisoning occurs in the chemical amplification type resist and the breaking of the wiring L2 occurs. The left portion in FIG. 20 indicates the case of the photoresist film PR3 normally formed and the right portion indicates the case of the photoresist film PR3 not normally formed with occurrence of a bad resolution.

The inventor et al. come to arrive at the following view as the result of consideration to a relation between the ammonium ion ($NH_4^+$) within the sealed type transfer container FP and the breaking.

Figure 21:
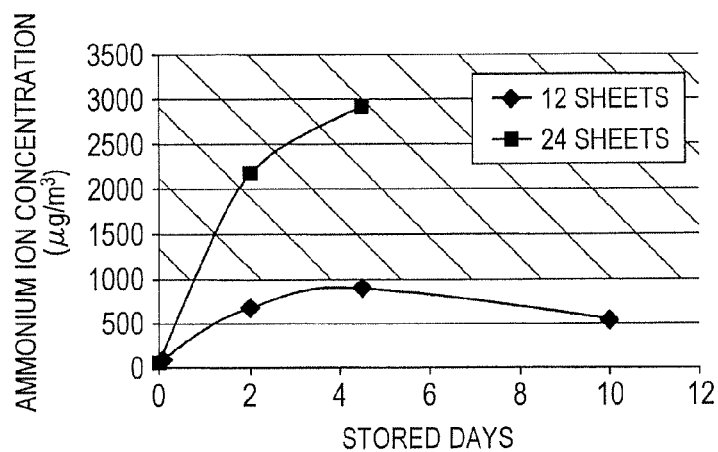
FIG. 21 is a view showing a relation between disconnection of wiring and ammonium concentration.

FIG. 21 is a view showing a relation between the breaking of the wiring L2 and the ammonium ion ($NH_4^+$) concentration within the sealed type transfer container FP. The case of storing twelve semiconductor wafers WF within the sealed type transfer container FP is compared with the case of storing twenty four wafers. The semiconductor wafer WF is in a state of having been subjected to the above mentioned wafer rear surface cleaning 3 (especially, the FPM cleaning) in Step S19, before the photoresist film PR3 forming process in Step S20, and the sealed type transfer container FP is hermetically closed without being purged with the nitrogen ($N_2$).

In the case of storing the twelve semiconductor wafers WF within the sealed type transfer container FP, the ammonium ion ($NH_4^+$) concentration rises from the start of the store, arriving at the maximum of about 900 $\mu g/m^3$ on the fourth day, then, the ammonium ion is absorbed by the via-fill PR2 on the main surface of the semiconductor substrate 1S, and the concentration is reduced. No breaking is found in the twelve semiconductor wafers WF.

On the other hand, in the case of storing the twenty four semiconductor wafers WF within the sealed type transfer container FP, the ammonium ion ($NH_4^+$) concentration rises continuously from the start of the store and arrives at 2000 $\mu g/m^3$ and more on the second day from the start. Breaking is found in the semiconductor wafers WF stored for the two days and more from the start. In FIG. 21, breaking is confirmed in the hatched region exceeding the ammonium ion ($NH_4^+$) concentration of 1000 μ/m³.

From the above result, in order to avoid the breaking, it is important that the ammonium ion ($NH_4^+$) concentration within the sealed type transfer container FP should be kept (controlled) at 1000 μg/m³ and less.

In the embodiment, it is important that after having been subjected to the wafer rear surface cleaning 3 (especially, the FPM cleaning) in Step S19, the semiconductor substrate 1S (semiconductor wafer WF) before the photoresist film PR3 forming process in Step S20 should be kept in an atmosphere with the ammonium ion ($NH_4^+$) concentration of 1000 μg/m³ and less. The sealed type transfer container FP may be purged with an inactive gas such as argon (Ar) instead of nitrogen ($N_2$), hence to control the ammonium ion concentration within the sealed type transfer container FP.

According to the embodiment, the following effects can be obtained.

After performing the wafer rear surface cleaning 3 on the rear surface of the semiconductor substrate 1S, the semiconductor substrate 1S is stored within the sealed type transfer container FP and the ammonium ion concentration within the sealed type transfer container FP is controlled at 1000 μg/m³ and less. According to this, it is possible to avoid the breaking of the wiring L2 generated by the resist poisoning of the photoresist film PR3 made of a positive chemical amplification type resist and improve the reliability of the semiconductor device.

Since the FPM cleaning is performed in the wafer rear surface cleaning 3, it is possible to avoid (reduce) the cross contamination in the manufacturing process of a semiconductor device and improve the manufacturing yield of the semiconductor device.

By controlling the ammonium ion ($NH_4^+$) concentration within the sealed type transfer container FP, it is possible to avoid a failure of the in-process product caused by a trouble of a device. Even when the semiconductor substrate 1S having been subjected to the wafer rear surface cleaning 3 is stored within the sealed type transfer container FP for a long time, the ammonium ion ($NH_4^+$) concentration does not excessively rise; there is no need to worry about the breaking of the wiring L2 caused by the resist poisoning.

As described by using FIG. 13, the photoresist film PR1 made of the chemical amplification type resist is used in forming the via hole VH, the wafer rear surface cleaning 2 is performed also before forming the photoresist film PR1, and the surface of the silicon nitride film formed on the rear surface of the semiconductor substrate 1S is exposed. During the period from the wafer rear surface cleaning 2 to the photoresist film PR1 formulation, the semiconductor substrate 1S is stored within the sealed type transfer container FP. In the patterning of the photoresist film PR1, however, the resist poisoning phenomenon is not found.

This can derive the assumption that the resist poisoning occurs in the photoresist film PR3 effected by the via-fill PR2 embedded into the via hole VH, when forming the wiring groove WD2. In other words, the ammonium ion ($NH_4^+$) released from the rear surface of the semiconductor substrate 1S intrudes into the via-fill PR2 made of an organic film and a large amount of amine is generated; as the result, the resist poisoning occurs in the photoresist film PR3. The embodiment is effective especially in the case of the via-fill PR2 (organic film) in direct contact with the photoresist film PR3 existing in the lower layer.

Modified Example 1

In a modified example 1, a scrub cleaning treatment while running pure water is performed on the rear surface of the semiconductor substrate is, continued to the wafer rear surface cleaning 3 in Step S19 in FIG. 2. In short, after sequentially performing the SPM cleaning and the FPM cleaning as the wafer rear surface cleaning 3 in Step 19, the pure water scrub cleaning is additionally performed on the rear surface of the semiconductor substrate 1S, and thereafter, the semiconductor substrate 1S is stored in the sealed type transfer container FP. Then, during the photoresist film PR3 forming process in Step S20, it is stored in the sealed type transfer container FP, with no need to manage the ammonium ion ($NH_4^+$) concentration within the sealed type transfer container FP. In short, there is no need to purge the sealed type transfer container FP with the nitrogen ($N_2$).

As mentioned above, after the FPM cleaning of the wafer rear surface cleaning 3, the silicon nitride film on the rear surface of the semiconductor substrate 1S is exposed; however, by performing the pure water scrub cleaning, a thin silicon oxide film can be formed on the surface of the silicon nitride film, hence to avoid (reduce) the ammonium ion from exhausting from the silicon nitride film. Therefore, even when the semiconductor substrate 1S is stored in the sealed type transfer container FP without purge with the nitrogen ($N_2$), the ammonium ion ($NH_4^+$) concentration within the sealed type transfer container FP can be kept at 1000 μg/m³ and less, hence to avoid the breaking of the wiring L2.

Needless to say, the semiconductor substrate 1S having been subjected to the pure ware scrub cleaning may be stored in the sealed type transfer container FP purged with the nitrogen ($N_2$). When carbon dioxide ($CO_2$) mixed pure water, ozone ($O_3$) water, or hydrogen peroxide ($H_2O_2$) is used, instead of pure water, the same effect can be obtained.

Modified Example 2

In a modified example 2, the wafer rear surface cleaning 3 in Step S19 in FIG. 2 includes only the SPM cleaning and does not include the FPM cleaning. In short, after performing the SPM cleaning as the wafer rear surface cleaning 3 in Step S19, the semiconductor substrate 1S is stored in the sealed type transfer container FP. Until the photoresist film PR3 forming process in Step S20, it is stored in the sealed type transfer container FP. Also in this case, there is no need to control the ammonium ion ($NH_4^+$) concentration within the sealed type transfer container FP. In other words, the sealed type transfer container FP does not have to be purged with the nitrogen ($N_2$).

Since the SPM cleaning is included in the wafer rear surface cleaning 3, the surface of the silicon nitride film on the rear surface of the semiconductor substrate 1S is in a state of being covered with a thin silicon oxide film, which can avoid (suppress) the ammonium ion from exhausting from the silicon nitride film. Even when the semiconductor substrate 1S is stored in the sealed type transfer container FP without purge with the nitrogen ($N_2$), the ammonium ion ($NH_4^+$) concentration can be kept at 1000 μg/m³ and less within the sealed type transfer container FP, which can avoid the breaking of the wiring L2.

Needless to say, the semiconductor substrate 1S just after the SPM cleaning may be stored in the sealed type transfer container FP purged with the nitrogen ($N_2$).

Figure 22:
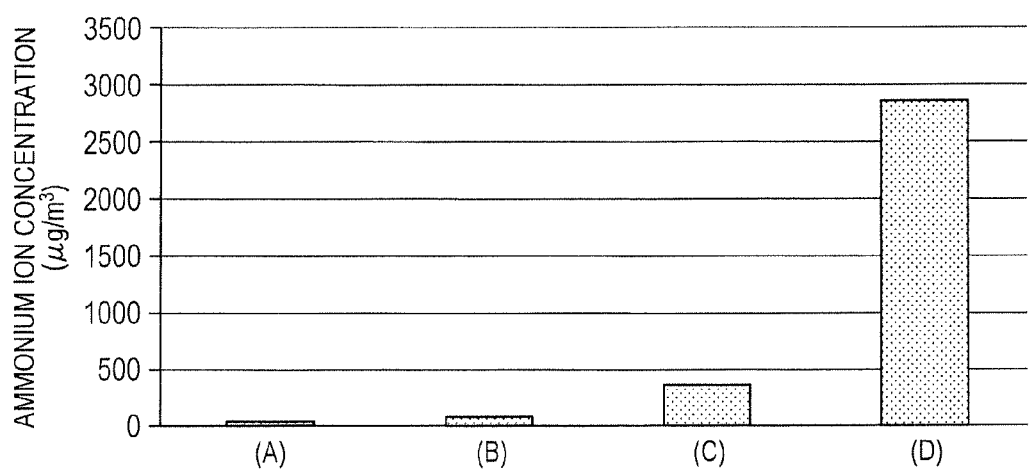
FIG. 22 is a view showing the effect of the embodiment.

FIG. 22 is a view showing the effect of the embodiment (including the modified examples 1 and 2). In the horizontal axis in FIG. 22, (A) shows the example of storing the semiconductor substrate 1S having been subjected to the wafer rear surface cleaning 3, in the sealed type transfer container FP purged with the nitrogen ($N_2$), (B) shows the example of storing the semiconductor substrate 1S having been subjected to the pure water scrub cleaning after the wafer rear surface cleaning 3, in the sealed type transfer container FP without purge of the nitrogen (N$_2$), (C) shows the example of storing the semiconductor substrate 1S having been subjected to only the SPM cleaning of the wafer rear surface cleaning 3, in the sealed type transfer container FP without purge of the nitrogen (N$_2$), and (D) shows the example (conventional example) of storing the semiconductor substrate 1S having been subjected to the wafer rear surface cleaning 3, in the sealed type transfer container FP without purge of the nitrogen (N$_2$). With the stored period defined as 4.5 days, it shows the ammonium ion (NH$_4^+$) concentration in the sealed type transfer container FP, in each example. In the examples of (A), (B) and (C), the ammonium ion (NH$_4^+$) concentration is less than 1000 μg/m$^3$, with no occurrence of the breaking of the wiring L2, but in the example of (D), the breaking occurs.

According to the embodiments (including the modified examples 1 and 2), it is possible to avoid the breaking of the wiring L2, hence to improve the reliability of the semiconductor device.

As set forth hereinabove, although the invention made by the inventor et al. has been described in detail based on the embodiments, it is needless to say that the invention is not restricted to this embodiments but various modifications are possible without departing from the spirit of the invention.

The above embodiments have been described using the example of forming a silicon nitride film on the rear surface of the semiconductor substrate 1S at a time of forming the insulating film IF working as an etching stopper; however, since a silicon nitride film forming the sidewall insulating film SW is also formed by the LPCVD method, a silicon nitride film is simultaneously formed on the main surface and the rear surface of the semiconductor substrate 1S. Therefore, the silicon nitride film for the sidewall insulating film SW is sometimes formed also on the rear surface of the semiconductor substrate 1S and the breaking of the wiring L2 can be avoided similarly to the embodiments.

What is claimed is:

1. A manufacturing method of a semiconductor device comprising steps of:
   (a) preparing a semiconductor substrate including a main surface and a rear surface, provided with a first silicon nitride film over the rear surface;
   (b) forming a first insulating film including a first opening portion over the main surface of the semiconductor substrate;
   (c) selectively forming a via-fill film made of an organic film within the first opening portion;
   (d) after the step (c), cleaning the rear surface of the semiconductor substrate to remove a natural oxide film on the first silicon nitride film so as to expose the first silicon nitride film;
   (d1) after the step (d), storing the semiconductor substrate in a sealed type transfer container in which the first silicon nitride film releases ammonium ions in the sealed type transfer container;
   (d2) after the step (d1), purging, through a purge hole in the sealed type transfer container, the ammonium ions with an inactive gas to control ammonium ion concentration in the sealed type transfer container; and
   (e) after the step (d2), forming a photoresist film made of chemical amplification type resist over the first insulating film and the via-fill film,
   wherein the photoresist film includes a second opening portion larger than the first opening portion, overlapping with the first opening portion.

2. The method according to claim 1,
   wherein the ammonium ion concentration in the sealed type transfer container is controlled by purging the inactive gas to be 1000 μg/m3 and less.

3. The method according to claim 1,
   wherein in the step (d), a mixed liquid of hydrofluoric acid and hydrogen peroxide is used to remove the oxide film covering the first silicon nitride film formed over the rear surface of the semiconductor substrate so as to expose the first silicon nitride film.

4. The method according to claim 1, further comprising steps of:
   after the step (e),
   (f) forming a third opening portion corresponding to the second opening portion in the first insulating film, by etching the first insulating film;
   (g) forming a metal film on the first insulating film to fill the first opening portion and the third opening portion; and
   (h) after the step (g), forming a wiring in the third opening portion and a plug electrode in the first opening portion, by performing a Chemical Mechanical Polishing (CMP) treatment on the metal film to remove a portion of the metal film around the third opening portion and expose the first insulating film.

5. The method according to claim 4,
   wherein the metal film is made of a copper film.

6. The method according to claim 1,
   wherein the step (a) further includes sub-steps of:
   (a1) forming a Metal Insulator Semiconductor Field Effect Transistor (MISFET) including a gate electrode, a source region, and a drain region, over the main surface of the semiconductor substrate; and
   (a2) after the step (a1), forming a second silicon nitride film over the main surface of the semiconductor substrate to cover the MISFET by a Low Pressure Chemical Vapor Deposition (LPCVD) method, and simultaneously, forming the first silicon nitride film over the rear surface of the semiconductor substrate.

7. The method according to claim 1,
   wherein the step (e) further includes sub-steps of:
   (e1) applying the chemical amplification type resist to cover the first insulating film and the via-fill film;
   (e2) irradiating the chemical amplification type resist with ultraviolet ray;
   (e3) after the step (e2), heating the chemical amplification type resist; and
   (e4) after the step (e3), developing the chemical amplification type resist.

8. The method according to claim 1,
   wherein the inactive gas is made of nitrogen or argon.

* * * * *